(12) United States Patent
Bowden et al.

(10) Patent No.: US 10,114,433 B2
(45) Date of Patent: Oct. 30, 2018

(54) THERMAL MANAGEMENT ASSEMBLY

(71) Applicant: HEWLETT PACKARD ENTERPRISE DEVELOPMENT LP, Houston, TX (US)

(72) Inventors: Thomas Robert Bowden, Houston, TX (US); Allen B Doerr, Magnolia, TX (US); John Franz, Houston, TX (US); Melvin K Benedict, Magnolia, TX (US); Joseph Allen, Tomball, TX (US); John Norton, Houston, TX (US); Binh Nguyen, Houston, TX (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 32 days.

(21) Appl. No.: 15/120,511

(22) PCT Filed: Apr. 30, 2014

(86) PCT No.: PCT/US2014/036158
§ 371 (c)(1),
(2) Date: Aug. 19, 2016

(87) PCT Pub. No.: WO2015/167528
PCT Pub. Date: Nov. 5, 2015

(65) Prior Publication Data
US 2016/0357233 A1    Dec. 8, 2016

(51) Int. Cl.
*H05K 7/20* (2006.01)
*G06F 1/20* (2006.01)
(Continued)

(52) U.S. Cl.
CPC .............. *G06F 1/206* (2013.01); *G06F 1/185* (2013.01); *G06F 1/20* (2013.01); *G06F 13/42* (2013.01);
(Continued)

(58) Field of Classification Search
CPC ............. G06F 1/185; G06F 1/206; G06F 1/20
(Continued)

(56) References Cited

U.S. PATENT DOCUMENTS 5,966,287 A    10/1999   Lofland et al.
6,233,150 B1 *  5/2001   Lin ...................... H05K 9/0039
                                                            165/185
(Continued)

FOREIGN PATENT DOCUMENTS

JP    2013520812    6/2013
KR    100856703     9/2008
(Continued)

OTHER PUBLICATIONS

PCT/ISA/KR, International Search Report, dated Jan. 27, 2015, PCT/US2014/036158, 18 pages.

*Primary Examiner* — Nidhi Thaker
(74) *Attorney, Agent, or Firm* — Hewlett Packard Enterprise Patent Department

(57) ABSTRACT

A thermal management assembly in accordance with one example may include a first thermal management member that includes a first main region that is continuous, a first connection region that is discontinuous, and a first top side. The thermal management assembly may also include a second thermal management member that includes a second main region, a second connection region, and a second top side. The second main region and the second connection region are continuous. The thermal management assembly may further include a connection member to couple the first (Continued)

thermal management member and the second thermal management member to a memory device via the first connection region and the second connection region. The first top side and the second top side are substantially level with a top side of the memory device in a horizontal direction when the first thermal management member and the second thermal management member are coupled to the memory device.

14 Claims, 4 Drawing Sheets

(51) Int. Cl.
  *G06F 1/18* (2006.01)
  *H01L 23/367* (2006.01)
  *H01L 23/40* (2006.01)
  *G06F 13/42* (2006.01)

(52) U.S. Cl.
  CPC ........ *H01L 23/367* (2013.01); *H01L 23/4093* (2013.01); *H01L 2924/0002* (2013.01)

(58) Field of Classification Search
  USPC .......................................... 361/704, 715, 720
  See application file for complete search history.

(56) References Cited

U.S. PATENT DOCUMENTS

| | | |
|---|---|---|
| 7,382,617 B2 | 6/2008 | Yu et al. |
| 7,518,873 B2 | 4/2009 | Park et al. |
| 8,018,723 B1 * | 9/2011 | Yu .......................... H01L 23/367 |
| | | 257/707 |
| 8,287,291 B1 | 10/2012 | Bhakta et al. |
| 8,488,325 B1 | 7/2013 | Yu |
| 8,559,181 B2 | 10/2013 | Clayton et al. |
| 8,649,177 B2 | 2/2014 | Chainer et al. |
| 8,913,384 B2 * | 12/2014 | David .................... H05K 13/00 |
| | | 361/679.53 |
| 9,250,934 B2 * | 2/2016 | Berke ...................... G11C 5/14 |
| 2007/0223198 A1 * | 9/2007 | Lai ...................... H01L 23/3672 |
| | | 361/720 |
| 2007/0263359 A1 * | 11/2007 | Lai ...................... H01L 23/3672 |
| | | 361/715 |
| 2008/0174965 A1 | 7/2008 | Hsu |
| 2009/0103269 A1 * | 4/2009 | Liu .......................... G06F 1/20 |
| | | 361/719 |
| 2010/0000655 A1 * | 1/2010 | Ni ...................... H01L 23/3672 |
| | | 156/60 |
| 2013/0343005 A1 | 12/2013 | David et al. |
| 2014/0004731 A1 | 1/2014 | Hoang |

FOREIGN PATENT DOCUMENTS

| | | |
|---|---|---|
| KR | 1020100016715 | 2/2010 |
| TW | I326023 | 2/1999 |
| TW | M354784 | 1/2006 |
| TW | 201311126 | 8/2011 |

* cited by examiner

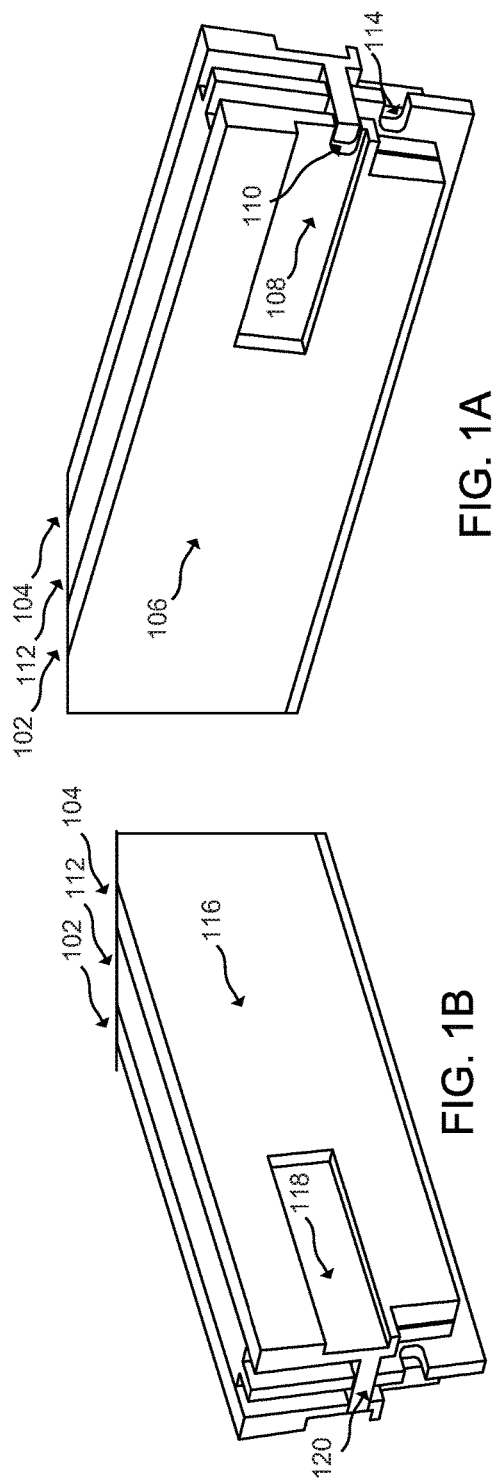
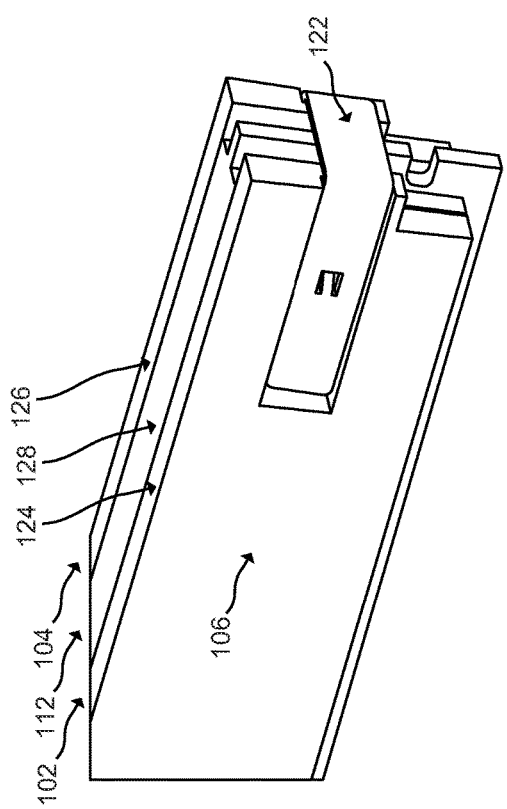
FIG. 1A
FIG. 1B
FIG. 1C

THERMAL MANAGEMENT ASSEMBLY

BACKGROUND

There are many types of computer data storage devices. One type of computer data storage device is random access memory (RAM). RAM is used to temporarily store data while a computing device is powered on. RAM may be implemented using integrated circuits in the form of a memory module, such as a dual-inline memory module (DIMM).

BRIEF DESCRIPTION OF THE DRAWINGS

Some examples of the present application are described with respect to the following figures:

FIG. 1A is a side view of an example first thermal management member of an example thermal management assembly;

FIG. 1B is a side view of an example second thermal management member of the example thermal management assembly;

FIG. 1C is a side view of an example connection member of the example thermal management assembly;

DETAILED DESCRIPTION

Figure 2A:
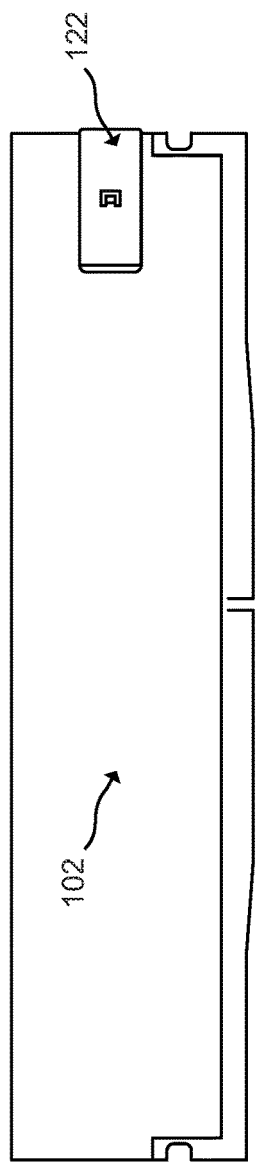
FIG. 2A is a front view of the example thermal management assembly of FIGS. 1A-1C.

As described above, random access memory (RAM) may be implemented using integrated circuits in the form of a memory module, such as a dual-inline memory module (DIMM). During operation, a DIMM may generate heat as a result of electrical current passing through the DIMM. The heat generated by a DIMM may increase the device temperature of the DIMM. Excessively high device temperature may reduce an operational life and/or function of a DIMM.

Examples described herein address the above challenges by providing a thermal management assembly that can be coupled to a memory device. For example, the thermal management assembly may include a first thermal management member, a second thermal management member, and a connection member. The connection member may couple the first thermal management member and the second thermal management member to a memory device, such as a DIMM. The first thermal management member may include a first main region that is continuous and a first connection region that is discontinuous. The second thermal management member may include a second main region and a second connection region. The second main region and the second connection region may be continuous. A first top side of the first thermal management member and a second top side of the second thermal management member may be substantially aligned with a top side of the memory device in a horizontal direction when the first thermal management member and the second thermal management member are coupled to the memory device. In this manner, examples described herein may enable a memory device to reduce a device temperature of the memory device.

Referring now to the figures, FIG. 1A is a side view of an example first thermal management member of an example thermal management assembly. The thermal management assembly may be a device suitable to extract or draw heat away from a semiconductor device, such as a memory device. The thermal management assembly may include a first thermal management member 102 and a second thermal management member 104. Second thermal management member 104 is described in more detail in FIG. 1B. First thermal management member 102 may include a first main region 106 and a first connection region 108. First main region 106 may be a continuous region. As used herein, a continuous region may be a region that is devoid of any through openings and/or recesses. In some examples, first main region 106 may be a substantially flat region that is devoid of any other features that extend from a surface of first main region 106, such as fins. First connection region 108 may be a recess region of first thermal management member 102. First connection region 108 may include an opening 110. Opening 110 may be a through opening to receive a connection tab from second thermal management member 104. Thus, first connection region 108 may be a discontinuous region. As used herein, a discontinuous region may be a region that includes a through opening. Opening 110 may be aligned with an upper notch (not shown) of a memory device 112 when first thermal management member 102 is coupled to memory device 112. In some examples, memory device 112 may be a DIMM that is compliant with a double data rate (DDR) 4 protocol. Memory device 112 may also include a lower notch 114.

FIG. 1B is a side view of an example second thermal management member of the example thermal management assembly. Second thermal management member 104 may include a second main region 116 and a second connection region 118. Second main region 116 may be a continuous region. In some examples, second main region 116 may be a substantially flat region that is devoid of any other features that extend from a surface of second main region 116, such as fins. Second connection region 118 may be a recess region of second thermal management member 104. Second connection region 118 may be a continuous region. Second connection region 118 may include a connection tab 120. Connection tab 120 may be inserted into opening 110 and upper notch of memory device 112. Thus, connection tab 120 may be aligned with the upper notch of memory device 112 when second thermal management member 104 is coupled to memory device 112.

FIG. 10 is a side view of an example connection member of the example thermal management assembly. The thermal management assembly may also include a connection member 122. Connection member 122 may be formed so that a first region of connection member 122 is inserted into first connection region 108 and a second region of connection member 122 is inserted into second connection region 118. Connection member 122 may couple first thermal management member 102 and second thermal management member 104 to memory device 112. Connection member 122 may be inserted into first connection region 108 and second connection region 118 in a horizontal direction so that the overall device height of memory device 112 is not increased when first thermal management member 102 and second thermal management member 104 are coupled to memory device 112. Thermal management members 102 and 104 and connection member 122 may be made using different materials, such as aluminum alloy, copper, or other metal. In some examples, thermal management members 102 and 104 may be vapor chambers, heat pipes, coolant liquid filled cavities, etc.

When first thermal management member 102 and second thermal management member 104 are coupled to memory device 112, a first top side 124 of first thermal management member 102 and a second top side 126 of second thermal management member are substantially flush or level with a third top side 128 of memory device 112 in a horizontal direction. For example, when first thermal management member 102 and second thermal management member 104 are coupled to memory device 112, a height difference among first top side 124, second top side 126, and third top side 128 may be approximately in the range of +/−0.010 inch. First top side 124 may have substantially the same thickness as first main region 106. Second top side 126 may have substantially the same thickness as second main region 116.

FIG. 2A is a front view of the example thermal management assembly of FIGS. 1A-1C. As illustrated in FIG. 2A, in some examples, first thermal management member 102 may include a single connection region, such as first connection region 108 (not shown in FIG. 2A). Second thermal management member 104 may also include a single connection region, such as second connection region 118 (not shown in FIG. 2A). Thus, a single connection member, such as connection member 122, may couple first thermal management member 102 and second thermal management member 104 to memory device 112.

Figure 2B:
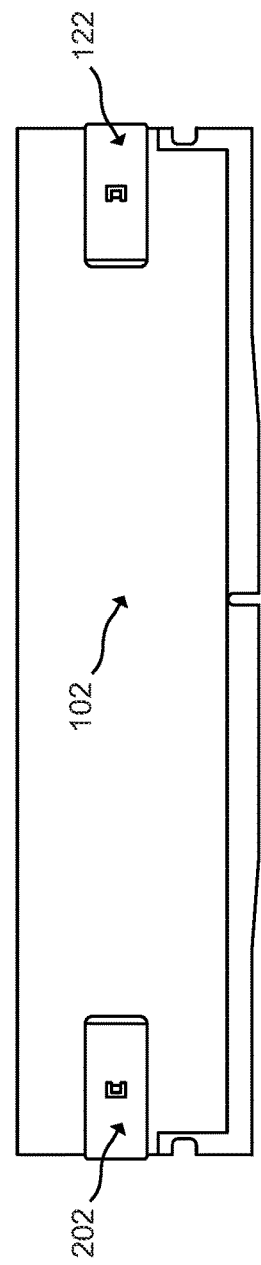
FIG. 2B is a front view of another example thermal management assembly of FIGS. 1A-1C.

FIG. 2B is a front view of another example thermal management assembly of FIGS. 1A-1C. As illustrated in FIG. 2B, in some examples, first thermal management member 102 may include multiple connection regions (not shown in FIG. 2B). Second thermal management member 104 may also include multiple connection regions (not shown in FIG. 2B). Thus, multiple connection members, such as connection member 122 and a second connection member 202, may be used to couple first thermal management member 102 and second thermal management member 104 to memory device 112.

Figure 3:
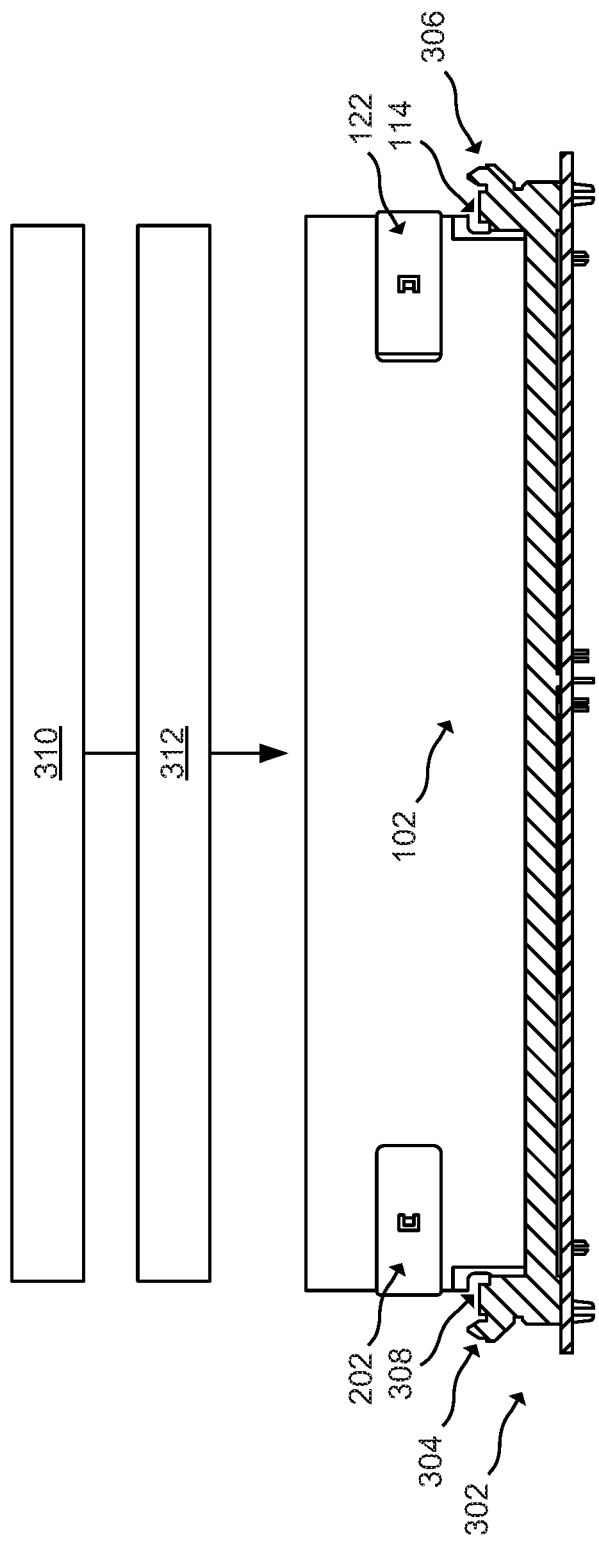
FIG. 3 is a front view of an example thermal management assembly inserted into an example memory device socket.

FIG. 3 is a front view of an example thermal management assembly inserted into an example memory device socket. During operation, memory device 112 coupled to first thermal management member 102 and second thermal management member 104 may be inserted into a memory device socket 302. Memory device socket 302 may include a first retention clip 304 and a second retention clip 306. Retention clips 304 and 306 may be pushed into lower notches 308 and 114 respectively to secure memory device 112 in memory device socket 302. Thus, by using memory device socket 302 to secure memory device 112 via lower notches 308 and 114, the overall height of memory device 112 when inserted into a memory device socket is not increased as compared to securing memory device 112 via the upper notches.

In some examples, heat may be removed from memory device 112 via liquid cooling. For example, a liquid cooling assembly 310 may be used to remove heat from memory device 112. Liquid cooling assembly 310 may include a plurality of components, such as a liquid pump and a reservoir. A liquid cooling plate 312 may be coupled to a liquid cooling assembly 310. Liquid cooling plate 312 may also be in contact with top sides of memory device 112 and thermal management members 102 and 104, such as top sides 124-128. During operation, memory device 112 may generate heat as a result of electrical current passing through circuits of memory device 112. Because main regions 106 and 116 are continuous, heat generated by memory device 112 may be absorbed by thermal management members 102 and 104 instead of dissipating into areas near memory device 112.

When liquid cooling plate 312 is in contact with top sides 124-128, liquid cooling plate 312 may draw heat absorbed thermal management members 102 and 104 and heat generated by memory device 112 away using liquid circulating through liquid cooling plate 312. Thus, the device temperature of memory device 112 is reduced.

Figure 4:
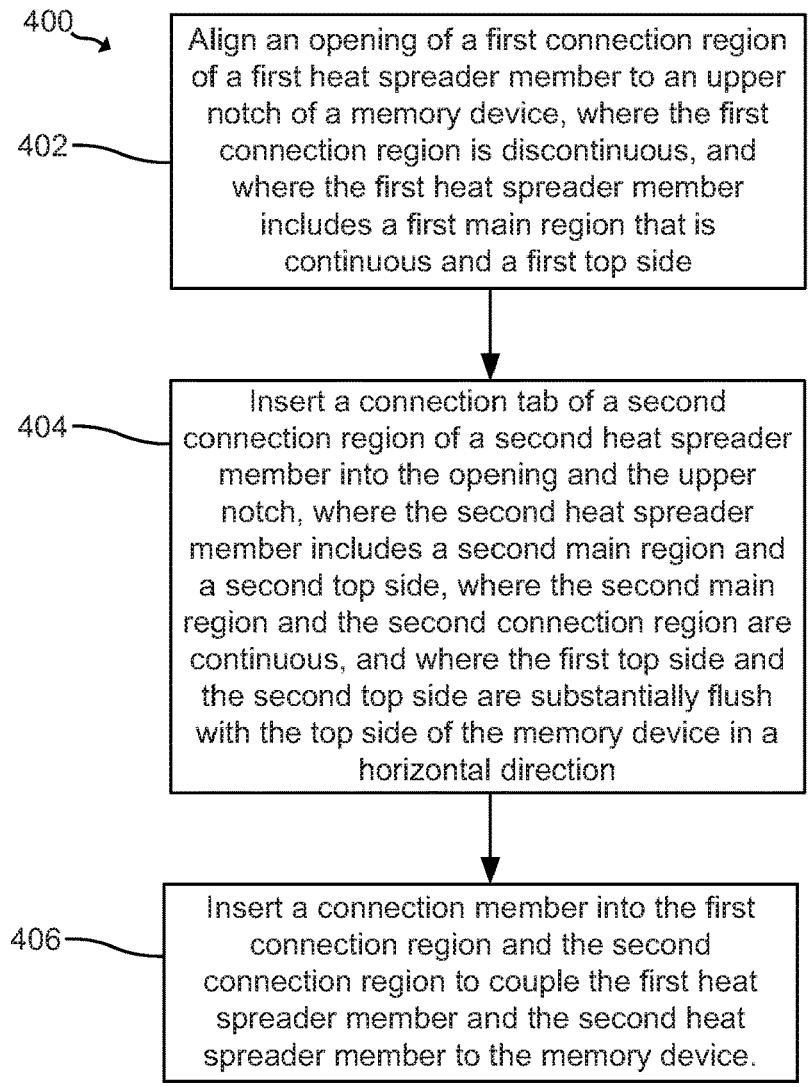
FIG. 4 is a flowchart illustrating an example method of coupling a thermal management assembly to a memory device.

FIG. 4 is a flowchart illustrating an example method 400 of coupling a thermal management assembly to a memory device. Method 400 includes aligning an opening of a first connection region of a first thermal management member to an upper notch of a memory device, where the first connection region is discontinuous, and where the first thermal management member includes a first main region that is continuous and a first top side, at 402. For example, referring to FIG. 1A, opening 110 may be aligned with an upper notch (not shown) of a memory device 112 when first thermal management member 102 is coupled to memory device 112.

Method 400 also includes inserting a connection tab of a second connection region of a second thermal management member into the opening and the upper notch, where the second thermal management member includes a second main region and a second top side, where the second main region and the second connection region are continuous, and where the first top side and the second top side are substantially flush with the top side of the memory device in a horizontal direction, at 404. For example, referring to FIG. 1B, connection tab 120 may be inserted into opening 110 and upper notch of memory device 112.

Method 400 further includes inserting a connection member into the first connection region and the second connection region to couple the first thermal management member and the second thermal management member to the memory device, at 406. For example, referring to FIG. 1C, connection member 122 may be inserted into first connection region 108 and second connection region 118 in a horizontal direction.

The use of "comprising", "including" or "having" are synonymous and variations thereof herein are meant to be inclusive or open-ended and do not exclude additional unrecited elements or method steps.

What is claimed is:

1. A thermal management assembly comprising:
   a first thermal management member including:
      a first main region that is continuous and devoid of a through opening;
      a first connection region that is discontinuous; and
      a first top side;
   a second thermal management member including:
      a second main region;
      a second connection region, wherein:
         the second main region and the second connection region are continuous;
         the second connection region includes a connection tab; and
         the first connection region and the second connection region are connected by the connection tab;
      a second top side; and
   a connection member to couple the first thermal management member and the second thermal management member to a memory device via the first connection region and the second connection region, wherein:
      the connection tab is located directly behind the connection member; and the first top side and the second top side are substantially level with a top side of the memory device in a horizontal direction when the first thermal management member and the second thermal management member are coupled to the memory device.

2. The thermal management assembly of claim 1, wherein the first connection region includes a first recess and an opening, wherein the second connection region includes a second recess and the connection tab, and wherein the connection tab is receivable in the opening.

3. The thermal management assembly of claim 1, wherein the second thermal management member is devoid of a through opening.

4. The thermal management assembly of claim 1, wherein the first top side has substantially the same thickness as the first main region, and wherein the second top side has substantially the same thickness as the second main region.

5. The thermal management assembly of claim 1, wherein the first top side and the second top side are substantially flat.

6. The thermal management assembly of claim 1, wherein the memory device includes a dual in-line memory module that is compliant with a double data rate 4 (DDR4) protocol.

7. A method comprising: aligning an opening of a first connection region of a first thermal management member to an upper notch of a memory device, wherein the first connection region is discontinuous, and wherein the first thermal management member includes a first main region that is continuous and devoid of a through opening, and a first top side; inserting a connection tab of a second connection region of a second thermal management member into the opening and the upper notch such that the first connection region and the second connection region are connected by the connection tab, wherein the second thermal management member includes a second main region and a second top side, wherein the second main region and the second connection region are continuous, and wherein the first top side and the second top side are substantially flush with a top side of the memory device in a horizontal direction; and inserting a connection member into the first connection region and the second connection region to couple the first thermal management member and the second thermal management member to the memory device, wherein the connection tab is located directly behind the connection member.

8. The method of claim 7, further comprising coupling a liquid cooling plate to the first top side, the second top side, and the top side of the memory device, wherein the first top side, the second top side, and the top side of the memory device are substantially flat.

9. The method of claim 7, wherein the second thermal management member is devoid of a through opening.

10. The method of claim 7, further comprising:
inserting the memory device coupled to the first thermal management member and to the second thermal management member into a memory device socket, wherein the memory device socket includes a retention clip; and
inserting the retention clip into a lower notch of the memory device.

11. An apparatus comprising:
a memory device including an upper notch and a lower notch;
a thermal management assembly coupled to the memory device via the upper notch,
wherein the thermal management assembly includes:
a first thermal management member including:
a first main region that is continuous and devoid of a through opening;
a first connection region that is discontinuous; and
a first top side;
a second thermal management member including:
a second main region;
a second connection region, wherein the second main region and the second connection region are continuous, and the second connection region includes a connection tab such that the first connection region and the second connection region are connected by the connection tab; and
a second top side;
a connection member to couple the first thermal management member and the second thermal management member to the memory device, wherein the first top side and the second top side are substantially flush with a top side of the memory device and the connection tab is located directly behind the connection member; and
a memory device socket electrically coupled to the memory device, wherein the memory device socket includes a retention clip receivable in the lower notch.

12. The apparatus of claim 11, wherein the first top side has substantially the same thickness as the first main region, and wherein the second top side has substantially the same thickness as the second main region.

13. The apparatus of claim 11, wherein the first top side and the second top side are substantially flat.

14. The apparatus of claim 11, wherein the memory device includes a dual in-line memory module that is compliant with a double data rate 4 (DDR4) protocol.

* * * * *